(12) United States Patent
Goswami

(10) Patent No.: US 8,530,305 B2
(45) Date of Patent: Sep. 10, 2013

(54) NANODOT CHARGE STORAGE STRUCTURES AND METHODS

(75) Inventor: Jaydeb Goswami, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 590 days.

(21) Appl. No.: 12/762,712

(22) Filed: Apr. 19, 2010

(65) Prior Publication Data

US 2011/0254072 A1   Oct. 20, 2011

(51) Int. Cl.
*H01L 21/02* (2006.01)

(52) U.S. Cl.
USPC ........... 438/257; 438/260; 438/264; 438/288; 977/773; 257/E21.003; 257/E21.422

(58) Field of Classification Search
USPC .................. 438/257, 260–261, 264, 287–288
See application file for complete search history.

(56) References Cited

U.S. PATENT DOCUMENTS

2004/0082171 A1* 4/2004 Shin et al. ..................... 438/689
2008/0218936 A1* 9/2008 Won et al. ..................... 361/303
2009/0028745 A1* 1/2009 Gatineau et al. .............. 420/462

OTHER PUBLICATIONS

Grumbine, et al., Base-Free Silylene Complexes Without fa-Donar Stabilization . . . J. Am Chem. Soc. (1994), vol. 116, No. 12, pp. 5495-5496.

* cited by examiner

*Primary Examiner* — Thanh Nguyen
(74) *Attorney, Agent, or Firm* — Brooks, Cameron & Huebsch PLLC

(57) ABSTRACT

Methods, devices, and systems associated with charge storage structures in semiconductor devices are described herein. In one or more embodiments, a method of forming nanodots includes forming at least a portion of a charge storage structure over a material by reacting a single-source precursor and a reactant, where the single-source precursor includes a metal and a semiconductor.

24 Claims, 3 Drawing Sheets

NANODOT CHARGE STORAGE STRUCTURES AND METHODS

TECHNICAL FIELD

The present disclosure relates generally to semiconductor memory devices and methods, and more particularly, in one or more embodiments to charge storage structures and methods.

BACKGROUND

Charge storage structures can be used in a variety of semiconductor devices, including non-volatile memory devices. The charge storage structures in semiconductor devices can include nanodots to store charge in the structure. Nanodots may be used in a wide variety of optical devices including light emitting diodes (LEDs), laser diodes (LDs), and photodetectors. Nanodots may also be used in single electron transistors. Through the use of nanodots, it may be possible to improve the performance of a device by reducing the threshold current of the device, improving retention characteristics, and/or increasing the optical gain.

For example, when a plurality of nanodots are distributed throughout a charge storage structure (e.g., floating gate) of a flash memory device, the voltage required for storing information may be smaller than the current required for a conventional flash memory device having no nanodots, and thus, the amount of power consumed may be decreased by using the nanodot device. The improved characteristics exhibited by the nanodot device may be attributed to Coulomb blockage at room temperature when nanodots smaller than approximately ten (10) nanometers (nm) in diameter are used for a charge storage structure, with the result that a threshold voltage shift may be quantized and multi-bit information may be stored. Accordingly, nanodot technology is considered promising for next-generation technology.

The size of semiconductor memory devices, and the thin dielectric films that are used in these devices, has been scaled down in order to accommodate the diminishing feature size of elements on a chip. One problem with the continued scaling down in floating gate memory devices is that the charge retention characteristics of the devices are sensitive to the presence or absence of defects in the tunnel oxide. A reduction in the thickness of the tunnel oxide, to allow for further scaling down can have drawbacks such as increased risk of defects occurring in the tunnel oxide, among other drawbacks.

DETAILED DESCRIPTION

Figure 1:
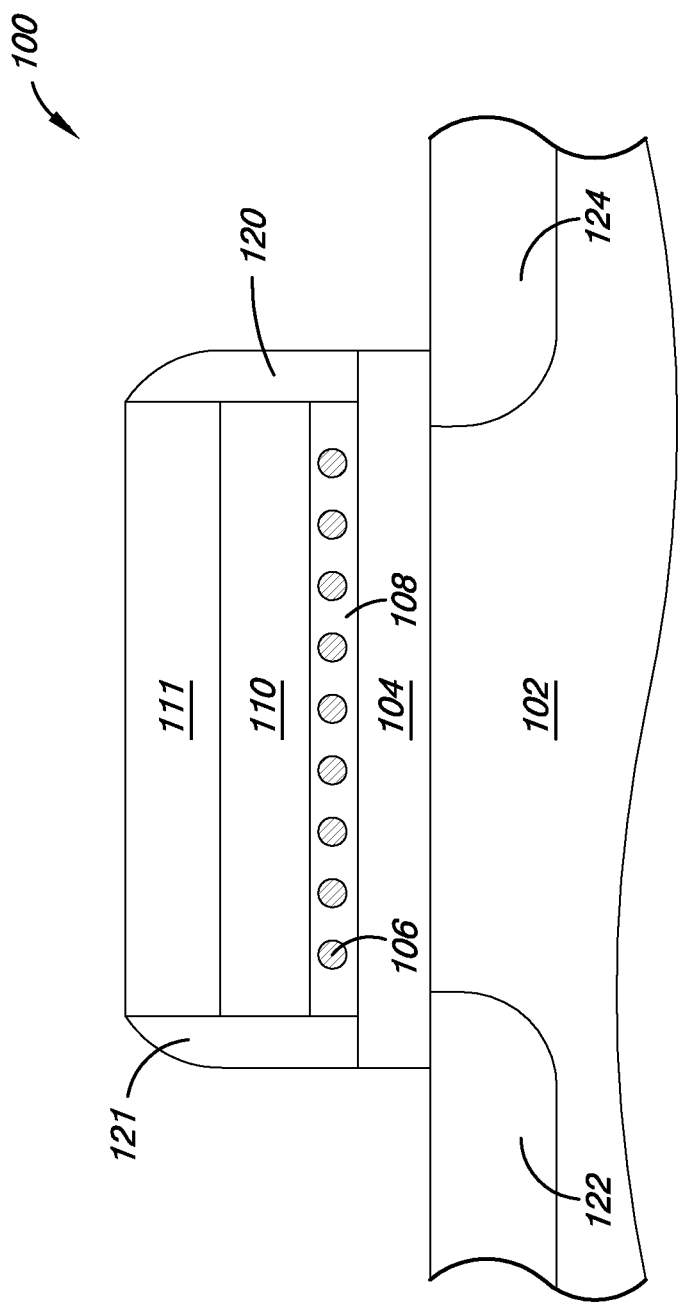
FIG. 1 illustrates a cross-sectional view of a portion of a memory formed in accordance with one or more embodiments of the present disclosure.

Methods, devices, and systems associated with charge storage structures in semiconductor devices are described herein. In one or more embodiments, a method of forming nanodots includes forming at least a portion of a charge storage structure over a material by reacting a single-source precursor and a reactant, where the single-source precursor includes a metal and a semiconductor.

One or more embodiments of the present disclosure can provide benefits such as reducing or eliminating oxidation in the nanodots and/or reducing delamination of the nanodots during the formation of the nanodot nonvolatile memory cell structures, among other benefits. For instance, one or more embodiments can provide the ability to control the stoichiometry and/or density of the nanodots, thus eliminating and/or reducing oxidization and delamination to reduce and/or eliminate single bit charge loss (SBCL), among various other benefits. The known induction time of a single-precursor can allow the composition and density of the elements in a nanodot to be controlled. In contrast, controlling the composition and density of a nanodot formed from more than one precursor is more difficult due to differences in the induction times of the different precursors.

Flash memory is one form of a nonvolatile memory having a charge storage structure, such as a floating gate, and will be referred to for illustrative purposes throughout this specification. However, embodiments of the present disclosure are not limited to flash memory cells and can be used with other non-volatile memory cells using nanodots as a charge storage structure, such as a floating gate, for instance.

The term "substrate" or "substrate assembly" used in the following description may include, for example, a number of semiconductor-based materials that have an exposed semiconductor surface. Semiconductors can be understood to include silicon, silicon-on-insulator (SOI), silicon-on sapphire (SOS), doped, and undoped semiconductors, for example. In addition, semiconductors can be understood to include epitaxial layers of silicon supported by a base semiconductor foundation, among other structures. The base semiconductor foundation is typically the lowest layer of silicon material on a wafer or a silicon layer deposited on another material.

The semiconductor need not be silicon-based. For example, the semiconductor can be silicon-germanium, germanium, or gallium-arsenide. When reference is made to "substrate" in the following description, previous process steps may have been utilized to create regions or junctions in or on the semiconductor. When reference is made to a substrate assembly, various process steps may have been previously used to form (e.g., define) various structures, such as regions, junctions, or features, and/or openings, such as capacitor plates or barriers for capacitors.

As used herein, "layer" can refer to a layer formed on a substrate using a deposition process. The term "layer" is meant to include layers specific to the semiconductor industry, such as "barrier layer," "dielectric layer," and "conductive layer." The term "layer" is also meant to include layers found in technology outside of semiconductor technology, such as coatings on glass.

Embodiments of the present disclosure will now be described in detail with reference to the accompanying figures. It should be noted that although the figures illustrate only one memory cell, the semiconductor structures contemplated herein can have more than one memory cell.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 106 may reference element "06" in FIG. 1, and a similar element may be referenced as 206 in FIG. 2. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present invention and are not to be used in a limiting sense.

FIG. 1 illustrates a cross-sectional view of a portion of a memory formed in accordance with one or more embodiments of the present disclosure. The cell 100 includes a dielectric material 104 formed on a semiconductor, such as a semiconductor substrate 102. The substrate 102 can be a silicon substrate or SOI substrate, among others. For example, the substrate 102 can be a p-type silicon substrate (for forming an n-channel storage device). The substrate 102 can include gallium arsenide (GaAs) or other semiconductor materials including, but not limited to: Si, Ge, SiGe, InAs, InP, CdS, and CdTe.

In one or more embodiments, the dielectric 104 can be a tunnel oxide. In such embodiments, the first dielectric 104 can be formed of a material such as silicon dioxide ($SiO_2$), and can be formed via thermal oxidation, for instance. Thermal oxidation can include heating the substrate 102 in an oxygen ambient at a temperature (e.g., approximately 800° C. to 1100° C.) until the oxide is formed on the surface of the substrate 102. It is also possible to form the first dielectric 104 by deposition processes such as, but not limited to, chemical vapor deposition (CVD) and plasma vapor deposition (PVD), etc.

In some embodiments, the first dielectric 104 can be formed of a high constant dielectric and/or a stack of materials including at least one barrier and at least one dielectric having a high dielectric constant. If a high constant dielectric is used, in some embodiments, a barrier can be formed between the high constant dielectric and the substrate 102.

In one or more embodiments, the thickness of the first dielectric 104 can depend upon the material selected and/or programming voltages to be used with the resulting memory cell 100. For example, in some embodiments, the first dielectric 104 formed of silicon dioxide can have a thickness of less than approximately ten (10) nanometers (nm). In some embodiments, the first dielectric 104 can have a thickness of approximately at least two (2) nm. In other embodiments, the first dielectric 104 can have a thickness in the range from approximately two (2) nm to four (4) nm.

As discussed herein, the charge storage structure of the present disclosure can include a number of nanodots 106 (e.g., one or more nanodots) that can form a plurality of charge traps in the charge storage structure of a memory cell 100. In one or more embodiments, the nanodots can form a discontinuous charge trapping region and the discontinuous charge trapping region can be less than approximately 1 monolayer in thickness. In some embodiments, for example, the nanodots 106 can have a size in the range of approximately one (1) to five (5) nm in diameter. In addition, the nanodots can be provided over the first dielectric layer 104 by chemical vapor deposition (CVD). Alternatively, in some embodiments, the nanodots 106 can also be deposited via atomic layer deposition (ALD), plasma assisted CVD, or plasma assisted CVD.

In one or more embodiments, the nanodots 106 can be formed from a single-source precursor. The single-source precursor can include a metal, a semiconductor, such as silicon and/or germanium, and a number of organic ligands. As an example, the single-source precursor can be ruthenium silylene complex with a molecular structure of L-Ru=Si-L', in which a first organic ligand (L) can be bonded to the metal (M), which in this example is ruthenium (Ru) and a second organic ligand (L') can be bonded to silicon (Si). For example, L can be selected from a group that includes, but is not limited to, Cp* ($PMe_3$)$_2$, CpEt, CpMe, where Cp*=$\eta^5$-$C_5Me_5$, Cp=$C_5H_5$, Et=$C_2H_5$, Me=$CH_3$ and L' can be selected from a group that includes, but is not limited to, $Me_2Cl$, $MeCl_2$, Cl, $Et_3$, $(Me_2N)_3$. The single-source precursor can be reacted with a reactant to create nanodots comprising the metal and silicon. In embodiments, the metal in the nanodots 106 can be selected from a group consisting of platinum (Pt), ruthenium (Ru), rhodium (Rh), iridium (Ir), chromium (Cr), titanium (Ti), molybdenum (Mo), tungsten (W), and/or osmium (Os), among other metals. In some embodiments, the nanodots 106 can be formed of a semiconductor. The use of other materials for the nanodots 106 is also possible.

In one example embodiment, nanodots 106 made of ruthenium can be deposited using a chemical vapor deposition process where, for example, a single-source precursor that includes a metal, silicon, and a number of organic ligands is combined with a reactant. For example, the reactant can be a nitrogen or hydrogen containing radical, such as $NH_3$, hydrogen ($H_2$), and/or nitrogen ($N_2$). The precursor and the reactant can be provided (e.g., introduced) supplied, etc., to the reactor at a temperature of approximately 50° Celsius (C) to 900° C. for approximately 5 seconds to 600 seconds. The reactant can be supplied to the reactor at a rate of approximately 10 standard cubic centimeters per minute (sccm) to 1000 sccm and the single-source precursor can be supplied to the reactor at a rate of approximately 5 milligrams per minute (mg/min) to 100 mg/min. In one or more embodiments, the single-source precursor and reactant can self-form as nanodots 106 on the first dielectric 104.

In one example embodiment, a second dielectric 108 can be formed over the nanodots 106. In some embodiments, the second dielectric 108 can be formed over the nanodots 106 by CVD. Since the nanodots 106 can be formed to be separate and isolated, the second dielectric 108 can be formed interstitially between the nanodots 106 (e.g., encasing the nanodots 106) in the second dielectric 108.

In some embodiments, the second dielectric 108 can be made from an advanced dielectric, for example, tantalum pent-oxide ($Ta_2O_5$), $BaSrTiO_3$, hafnium oxide ($HfO_2$), or zirconium dioxide ($ZrO_2$), aluminum oxide ($Al_2O_3$), which have high dielectric constants (approximately ten (10) or greater) when deposited. As used herein, an advanced dielectric is a dielectric which allows device scaling below approximately 0.1 µm. Advanced dielectric materials are useful for maintaining and/or increasing the amount of energy at a given voltage that each device can store, thereby reducing operating voltages.

In some embodiments, the first dielectric 104 and second dielectric 108 comprise a composite layer. Although not shown, in such embodiments, a barrier of silicon dioxide can be formed over the second dielectric 108 when the second dielectric 108 comprises an advanced dielectric.

As shown in the example embodiment of FIG. 1, an intergate dielectric 110 can be deposited on the second dielectric

108. In some embodiments, the intergate dielectric 110 can be silicon nitride. In addition, in such embodiments the silicon nitride can be deposited by LPCVD. In one or more embodiments, a control gate 111 can be formed on the intergate dielectric 110. The control gate 111 can be formed of tantalum nitride (TaN), titanium nitride (TiN), or poly-silicon ($p^+$), among other materials.

In FIG. 1, spacers 120 and 121 can be included in memory cells to isolate a memory cell 100 from another memory cell in an array. In one or more embodiments, the spacers 120 and 121 cover the sidewall surface of the second dielectric 108, which contains the nanodots 106, the integrate dielectric 110, and the control gate 111. As discussed herein, the spacer 120 can be formed of nitride compounds, which can have etch stopping capabilities. In addition, source/drain regions 122, 124 can be formed by a suitable process, as processes for such implantation are used in the relevant industry. For example, in one embodiment, the source/drain regions 122, 124 are formed by ion-implantation of dopants into the substrate.

In one or more embodiments, a spacer can be deposited to form a composite with the first dielectric and second dielectric. The spacer can be used to isolate the memory cell from other memory cells. In such embodiments, the intergate dielectric and control can be formed on the second dielectric that contains the nanodots. The source/drain regions can also be formed by a suitable process, as processes for such implantation are used in the relevant industry.

The memory cell 100 can be efficiently fabricated and can use the nanodots 106 as a charge storage structure. Accordingly, a semiconductor device of an embodiment of the present disclosure is suitable as a non-volatile memory and can be scaled for future technologies. The semiconductor device can be used as a charge storage device which stores one electron per nanodot, or as a device which stores more than one electron per nanodot. Furthermore, a semiconductor device according to the present disclosure can be more reliable in that if one of the nanodots fails, the other nanodots will not be affected.

Figure 2:
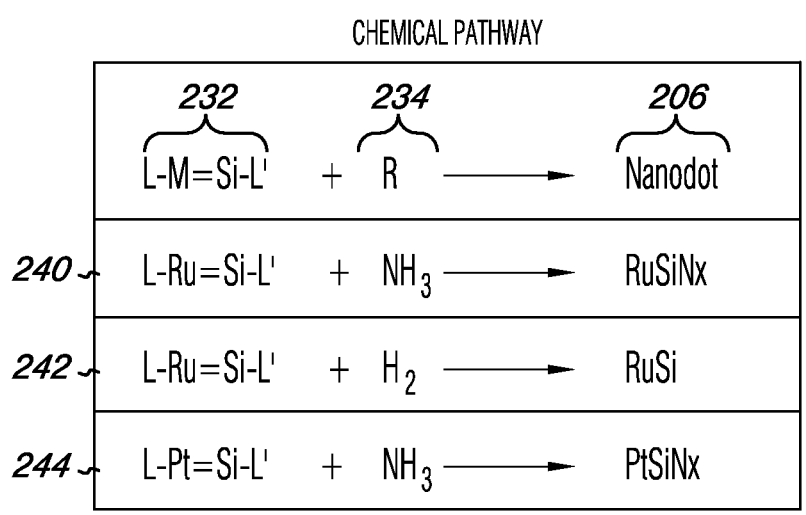
FIG. 2 is a table that illustrates the chemical pathways of a nanodot formed in accordance with one or more embodiments of the present disclosure.

FIG. 2 is a table 230 that illustrates the chemical pathways of a nanodot 206 formed in accordance with one or more embodiments of the present disclosure. In FIG. 2, nanodots 206 can be formed by reacting a number of single-source precursors 232 and a number of reactants (R) 234. The chemical pathway 240 illustrates a single-source precursor that includes a first organic ligand (L) bonded to ruthenium (Ru) and a second organic ligand L' bonded to silicon (Si). This single-source precursor 232 is reacted with a reactant 234 that is ammonia ($NH_3$) to form a nanodot 206 that includes ruthenium, silicon, and nitrogen ($RuSiN_x$).

In one or more embodiments, the chemical pathway 242 illustrates a single-source precursor that includes a first organic ligand (L) bonded to ruthenium (Ru) and a second organic ligand U bonded to silicon (Si). This single-source precursor 232 is reacted with a reactant 234 that is hydrogen ($H_2$) to form a nanodot 206 that includes ruthenium and silicon (RuSi).

In one or more embodiments, the chemical pathway 244 illustrates a single-source precursor that includes a first organic ligand (L) bonded to platinum (Pt) and a second organic ligand L' bonded to silicon (Si). This single-source precursor 232 is reacted with a reactant 234 that is ammonia ($NH_3$) to form a nanodot 206 that includes platinum, silicon, and nitrogen ($PtSiN_x$). Embodiments of the present disclosure are not limited to the chemical pathways illustrated in table 230 and can include any suitable single-source precursor that includes a metal and a semiconductor and any suitable reactant to form a nanodot. The known induction time of a single-precursor can allow the composition and density of the elements in a nanodot to be controlled.

In previous approaches, ruthenium silicon nanodots were formed using two or more precursors. A ruthenium containing precursor and a silicon containing precursor were introduced in a reactor to form ruthenium silicon nanodots. The differing induction times of the ruthenium containing precursor and the silicon containing precursor made controlling the composition and density of the nanodot formed from more than one precursor more difficult.

Figure 3:
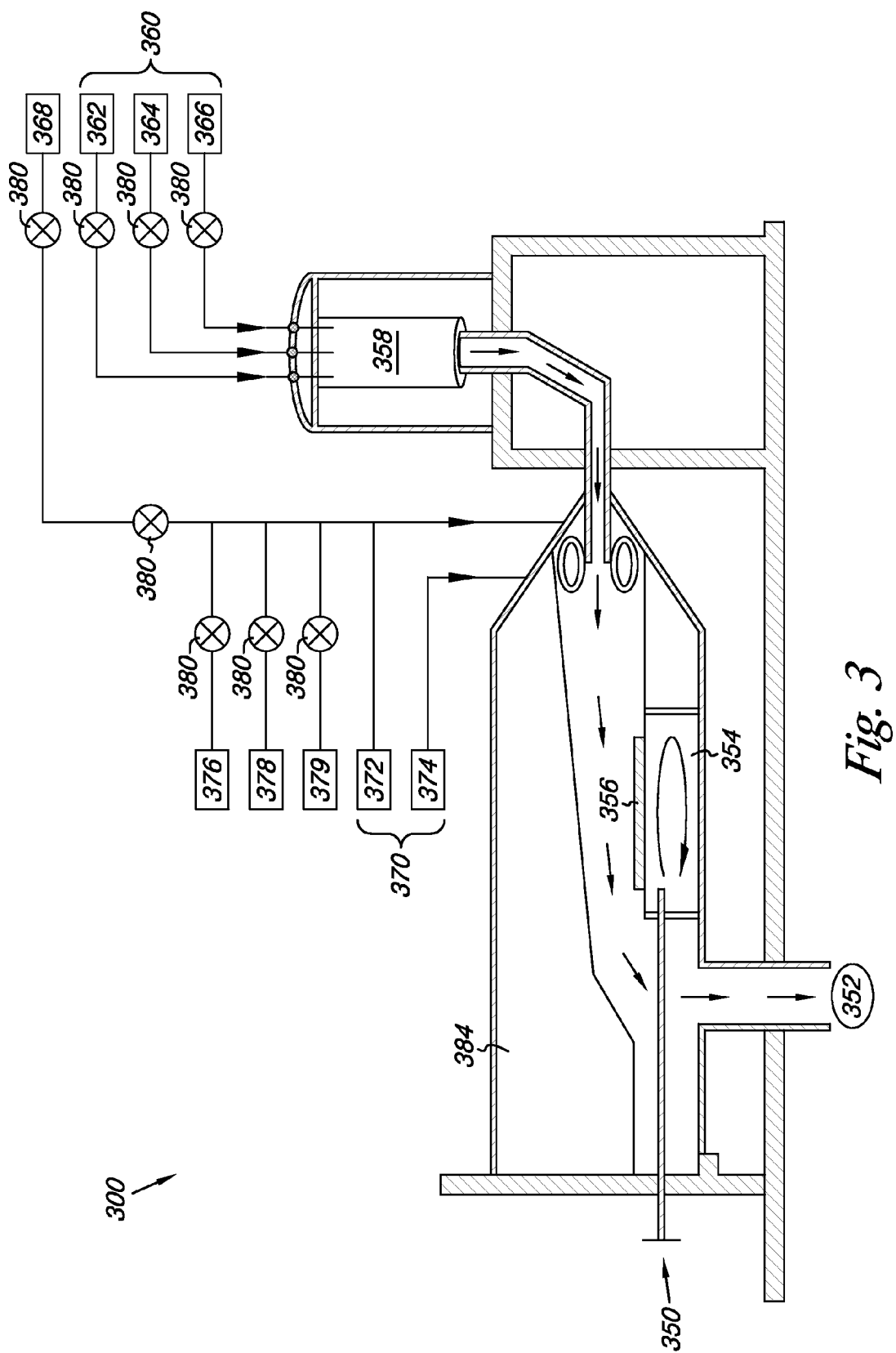
FIG. 3 illustrates a metalorganic chemical vapor deposition and atomic layer deposition (MOCVD/ALD) reactor that can be used in accordance with one or more embodiments of the present disclosure.

FIG. 3 illustrates a MOCVD/ALD reactor 300 that can be used in accordance with one or more embodiments of the present disclosure. The elements depicted permit discussion of the present disclosure such that those skilled in the art may practice embodiments without undue experimentation. In FIG. 3, a target 356 (e.g., substrate) can be located inside a reaction chamber 384 of reactor 300. Also located within the reaction chamber 384 can be a heated rotary stage 354, which can be thermally coupled to target 356 to control the target temperature. A vaporizer 358 can introduce a precursor to the target 356. The precursor can originate from sources 360, including sources 362, 364, and 366, whose flow can be controlled by mass-flow controllers 380. Sources 360 can provide a precursor by providing a liquid material to form the selected precursor gas in vaporizer 358.

Also included in the reactor 300 can be purging gas sources 370 including 372 and 374. Furthermore, additional purging gas sources can be constructed in reactor 300, one purging gas source for each precursor gas, for example. For a process that uses the same purging gas for multiple precursor gases there are less purging gas sources for the reactor 300. The reactor 300 also can provide gas sources 368, 376, 378, and 379 to reaction chamber 384 without being vaporized. Reaction chamber 384 also can be coupled to vacuum pump, or exhaust pump, 352, after thermocouple 350, to remove excess precursor gases, purging gases, and by-product gases at the end of a purging sequence from the reaction chamber 384.

For convenience, control displays, mounting apparatus, temperature sensing devices, substrate maneuvering apparatus, and necessary electrical connections as are known to those of ordinary skill in the art are not shown in FIG. 3. Though reactor 300 is well suited for practicing the embodiments of the present disclosure, other reactor systems commercially available can be used.

Reactor 300 can be used to form a first dielectric (e.g., 104) as described above in connection with FIG. 1. Nanodots (e.g., nanodots 106 in FIG. 1) can be formed using reactor 300. The nanodots can be formed from a single-source precursor. The precursor can be a metal, silicon, organic ligand precursor. For example, the metal can be Ruthenium (Ru) and the precursor can have a molecular structure of L-Ru=Si-L', where L and L' are organic ligands. The precursor can be provided to the reactor from a source (e.g., 362, 364, or 366). In some embodiments, the precursor and be introduced through an evaporator (e.g., vaporizer 358). In some embodiments, the precursor can be dissolved in a solvent (e.g., toluene) and provided to the reactor 300 by a liquid delivery system. A reactant from gas sources 376, 378, and/or 379 can be provided to the reaction chamber 384. The reactant can be various radicals that contain hydrogen and/or nitrogen, such as $H_2$ or ammonia ($NH_3$), for example. The reactant and the precursor can be provided to the reaction chamber 384 at a rate of approximately 10 standard cubic centimeters per minute (sccm) to 1000 sccm and approximately 5 milligrams per minute (mg/min) to 100 mg/min, respectively. The reaction chamber can be kept at a temperature of approximately 50° Celsius (C) to 900° C. for approximately 5 seconds to 600 seconds to form the nanodots. The precursor and the reactant can form ruthenium silicon nitride (RuSiN$_x$) nanodots.

In one or more embodiments, the reaction of the precursor and the reactant can control the amount of nitrogen in the nanodots and also the amount of oxidation that occurs in the nanodots by controlling the partial pressure of the reactant in the reactor. The induction time of the single-source precursor is known, therefore the Si and N content of the nanodots and the oxidation of the nanodots can be controlled when forming the nanodots.

In one or more embodiments, other elements of a memory cell (e.g., intergate dielectric, control gate, spacers, source/drain, etc.) can be formed using fabrication techniques known to those of ordinary skill in the art.

Methods, devices, and systems associated with charge storage structures in semiconductor devices are described herein. In one or more embodiments, a method of forming nanodots includes forming at least a portion of a charge storage structure over a material by reacting a single-source precursor and a reactant, where the single-source precursor includes a metal and a semiconductor.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. As used herein, the term "and/or" includes any and all combinations of one or more of the associated listed items.

It will be understood that, although the terms first, second, etc. may be used herein to describe various elements and that these elements should not be limited by these terms. These terms are only used to distinguish one element from another element. Thus, a first element could be termed a second element without departing from the teachings of the present disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure.

It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method of forming a charge storage structure, comprising:
    forming at least a portion of a charge storage structure over a material by reacting a single-source precursor and a reactant to form a number of nanodots, where the single-source precursor includes a metal and a semiconductor and where the number of nanodots are a compound that includes metal, silicon, and nitrogen.

2. The method of claim 1, including reacting the single-source precursor and the reactant, where the metal in the single source-precursor is ruthenium and the semiconductor in the single-source precursor is silicon and the reactant is ammonia (NH$_3$).

3. The method of claim 1, including reacting the single-source precursor and the reactant, where the metal in the single source-precursor is ruthenium and the semiconductor in the single-source precursor is germanium and the reactant is ammonia (NH$_3$).

4. The method of claim 1, including forming the number of nanodots over the material by reacting the single-source precursor and the reactant, where the content of nitrogen in the nanodots that include metal, silicon, and nitrogen is controlled by the partial pressure of the reactant when reacting the single-source precursor and the reactant.

5. The method of claim 1, where forming at least a portion of the charge storage structure includes reacting the single-source precursor that includes a metal, silicon, a first organic ligand, and a second organic ligand.

6. The method of claim 1, where forming at least a portion of the charge storage structure includes forming a number of nanodots as a discontinuous film of nanodots that act as a charge storage structure in a memory cell.

7. A method of forming a charge storage structure, comprising:
    providing a reactant to a reactor;
    providing a single-source precursor to the reactor, where the single-source precursor includes a metal, silicon, a first organic ligand, and a second organic ligand; and
    reacting the reactant and the single-source precursor to form metal-silicon nanodots on a material.

8. The method of claim 7, where reacting the reactant and single-source precursor includes reacting a hydrogen or nitrogen containing radical and the single-source precursor.

9. The method of claim 8, where the hydrogen or nitrogen containing radical is ammonia (NH$_3$).

10. The method of claim 8, where the hydrogen or nitrogen containing radical is hydrogen (H$_2$).

11. The method of claim 8, where the hydrogen or nitrogen containing radical is nitrogen (N$_2$).

12. The method of claim 7, where reacting the reactant includes reacting a nitrogen containing radical and the single-source precursor for approximately 5 seconds to 600 seconds.

13. The method of claim 7, where reacting the reactant includes reacting a nitrogen containing radical and the single-source precursor at a temperature of approximately 50° Celsius (C) to 900° C.

14. The method of claim 7, where providing the reactant to the reactor includes providing the nitrogen containing radical to the reactor at a rate of approximately 10 standard cubic centimeters per minute (sccm) to 1000 sccm.

15. The method of claim 7, where providing the single-source precursor includes providing the single-source precursor to the reactor at a rate of approximately 5 milligrams per minute (mg/min) to 100 mg/min.

16. A method of fabricating a memory cell, comprising:

forming nanodots over a first dielectric material, where the nanodots are formed by reacting a nitrogen containing radical with a single-source precursor of a metal, silicon, a first organic ligand, and a second organic ligand;

forming a second dielectric material over the nanodots, where the second dielectric material encases the nanodots;

forming a third dielectric material over the second dielectric material; and forming a control gate over the third dielectric material.

17. The method of claim 16, where forming nanodots includes forming a discontinuous film of nanodots that is less than approximately 1 monolayer thick.

18. The method of claim 16, where forming nanodots includes forming nanodots that are each approximately 1 nanometer (nm) to 2 nm wide.

19. The method of claim 16, where forming nanodots includes forming ruthenium-silicon nanodots.

20. The method of claim 16, where forming the nanodots includes forming the nanodots using chemical vapor deposition (CVD).

21. The method of claim 16, where forming the nanodots includes forming the nanodots using atomic layer deposition (ALD).

22. The method of claim 16, where forming the nanodots includes forming the nanodots using plasma assisted chemical vapor deposition (CVD).

23. The method of claim 16, where forming the nanodots includes forming the nanodots using plasma assisted atomic layer deposition (ALD).

24. A method of forming a charge storage structure, comprising:

forming at least a portion of a charge storage structure over a material by reacting a single-source precursor and a reactant to form a number of nanodots as a discontinuous film of nanodots that act as a charge storage structure in a memory cell, where the single-source precursor includes a metal and a semiconductor.

* * * * *